(12) United States Patent
Kwak

(10) Patent No.: US 7,876,591 B2
(45) Date of Patent: Jan. 25, 2011

(54) SEMICONDUCTOR MEMORY DEVICE AND METHOD OF FORMING A LAYOUT OF THE SAME

(75) Inventor: Pan-Suk Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 148 days.

(21) Appl. No.: 12/078,138

(22) Filed: Mar. 27, 2008

(65) Prior Publication Data

US 2008/0239781 A1 Oct. 2, 2008

(30) Foreign Application Priority Data

Apr. 2, 2007 (KR) .................. 10-2007-0032469

(51) Int. Cl.
*G11C 5/02* (2006.01)
(52) U.S. Cl. .......................... 365/51; 365/63; 365/53
(58) Field of Classification Search ............... 365/51, 365/53, 63
See application file for complete search history.

(56) References Cited

U.S. PATENT DOCUMENTS

| | | | | |
|---|---|---|---|---|
| 4,339,766 A | * | 7/1982 | Rao | 365/149 |
| 4,694,428 A | * | 9/1987 | Matsumura et al. | 365/51 |
| 4,984,196 A | * | 1/1991 | Tran et al. | 365/51 |
| 5,023,839 A | * | 6/1991 | Suzuki et al. | 365/185.21 |
| 5,091,887 A | * | 2/1992 | Asakura | 365/206 |
| 5,371,707 A | * | 12/1994 | Ogawa | 365/190 |
| 5,608,241 A | * | 3/1997 | Shibuya et al. | 257/207 |
| 5,625,590 A | * | 4/1997 | Choi et al. | 365/185.17 |
| 5,657,269 A | * | 8/1997 | Nanamiya | 365/185.17 |
| 5,973,983 A | * | 10/1999 | Hidaka | 365/230.03 |
| 6,097,654 A | * | 8/2000 | Kikuchi | 365/210.1 |
| 6,111,777 A | * | 8/2000 | Ogiwara et al. | 365/145 |
| 6,188,608 B1 | * | 2/2001 | Maruyama et al. | 365/185.2 |
| 6,363,027 B1 | * | 3/2002 | Komatsu | 365/230.03 |
| 6,376,884 B1 | * | 4/2002 | Hotta | 257/379 |
| 6,459,634 B1 | * | 10/2002 | Sher | 365/201 |
| 6,531,357 B2 | | 3/2003 | Takeuchi et al. | |
| 6,631,089 B1 | * | 10/2003 | Ogura et al. | 365/185.23 |
| 6,649,945 B1 | * | 11/2003 | Hosono et al. | 257/210 |
| 6,700,168 B2 | * | 3/2004 | Yang | 257/401 |

(Continued)

FOREIGN PATENT DOCUMENTS

JP   2002-064043   2/2002

(Continued)

*Primary Examiner*—Viet Q Nguyen
(74) *Attorney, Agent, or Firm*—Lee & Morse, P.C.

(57) ABSTRACT

A semiconductor memory device having a double-patterned memory cell array that includes a plurality of first bit lines spaced apart from each other and having a first pattern, a plurality of second bit lines spaced apart from each other and having a second pattern, the second bit lines being between the first bit lines to define an alternating array of first and second bit lines, the first and second patterns being different from each other, a first main memory cell array defined by a first portion of the alternating array, a second main memory cell array defined by a second portion of the alternating array, bit lines in the first main memory cell array having a substantially same regularity as bit lines in the second main memory cell array, and a dummy array between the first main memory cell array and the second main memory cell array.

16 Claims, 3 Drawing Sheets

U.S. PATENT DOCUMENTS

| | | |
|---|---|---|
| 6,716,761 B2 | 4/2004 | Mitsuiki |
| 6,721,198 B2 * | 4/2004 | Kang .......................... 365/145 |
| 6,807,119 B2 * | 10/2004 | Fasoli et al. .............. 365/210.1 |
| 6,894,943 B2 * | 5/2005 | Suzuki et al. .......... 365/230.03 |
| 7,177,216 B2 * | 2/2007 | Suh et al. .................... 365/205 |
| 7,235,855 B2 * | 6/2007 | Satomi ....................... 257/508 |
| 7,236,396 B2 * | 6/2007 | Houston et al. ........ 365/185.07 |
| 7,372,715 B2 * | 5/2008 | Han ............................ 365/63 |
| 7,417,895 B2 * | 8/2008 | Cho ..................... 365/185.17 |
| 7,456,457 B2 * | 11/2008 | Choi ........................... 257/296 |
| 7,518,909 B2 * | 4/2009 | Park et al. .............. 365/185.02 |
| 7,535,761 B2 * | 5/2009 | Park et al. ............... 365/185.12 |
| 7,649,760 B2 * | 1/2010 | Hong et al. ................... 365/51 |
| 2006/0194429 A1 * | 8/2006 | Hashimoto et al. .......... 438/625 |
| 2006/0228636 A1 | 10/2006 | Mashita et al. |
| 2007/0158693 A1 * | 7/2007 | Yune .......................... 257/213 |

FOREIGN PATENT DOCUMENTS

| | | |
|---|---|---|
| KR | 10-2002-0061480 A | 7/2002 |
| KR | 10-2006-0108233 A | 10/2006 |
| KR | 10-2007-0003338 A | 1/2007 |

* cited by examiner

SEMICONDUCTOR MEMORY DEVICE AND METHOD OF FORMING A LAYOUT OF THE SAME

BACKGROUND OF THE INVENTION

1. Field of the Invention

Embodiments of the present invention relate to a semiconductor memory device. More particularly, embodiments of the present invention relate to a layout of a memory cell array of a semiconductor memory device formed using a double patterning technology and a method of forming the same.

2. Description of the Related Art

A conventional memory cell array of a semiconductor memory device may include selection lines, a common source line, selection transistors, memory transistors, a plurality of bit lines intersecting with a plurality of word lines, and active devices below the bit lines. The conventional memory cell array, e.g., the bit lines, may be formed by single patterning in accordance with semiconductor high density integration design rules requiring predetermined critical dimensions (CD), e.g., predetermined tolerances of line widths and spaces therebetween. The conventional single patterning may refer to technology of forming patterns of a semiconductor integrated circuit using a single exposure technology.

However, when a layout of a memory cell array is formed using single patterning, resolution of the memory cell array may be substantially limited. For example, it may be difficult to form patterns having CD values, e.g., a pitch of patterns, below about 50 nm. Further, attempts to use double patterning to form a layout of a memory cell array having a reduced pitch have provided minimized symmetry in the main memory cells, so the bit lines and the active devices below the bit lines exhibited non-uniform electrical properties, e.g., non-uniform unit resistance, non-uniform unit capacitance, and so forth.

SUMMARY OF THE INVENTION

Embodiments of the present invention are therefore directed to a semiconductor memory device and a method of forming a layout of the same, which substantially overcomes one or more of the disadvantages of the related art.

It is therefore a feature of an embodiment of the present invention to provide a layout of a double-patterned memory cell array with increased regularity of main memory cells therein.

It is another feature of an embodiment of the present invention to provide a semiconductor memory device having a layout of a double-patterned memory cell array with increased regularity of main memory cells therein.

It is yet another feature of an embodiment of the present invention to provide a memory core having a layout of a double-patterned memory cell array with increased regularity of main memory cells therein.

It is still another feature of an embodiment of the present invention to provide a method of forming a semiconductor memory device having a layout of a memory cell array with increased regularity of main memory cells therein via double-patterning technology.

At least one of the above and other features and advantages of the present invention may be realized by providing a semiconductor memory device having a double-patterned memory cell array, the memory cell array including a plurality of first bit lines spaced apart from each other and having a first pattern, a plurality of second bit lines spaced apart from each other and having a second pattern, the second bit lines being between the first bit lines to define an alternating array of first and second bit lines, the first and second patterns being different from each other, a first main memory cell array defined by a first portion of the alternating array, a second main memory cell array defined by a second portion of the alternating array, bit lines in the first main memory cell array having a substantially same regularity as bit lines in the second main memory cell array, and a dummy array between the first main memory cell array and the second main memory cell array.

The dummy array may include an even number of dummy bit lines. A first bit line in the first main memory cell array and a first bit line in the second main memory cell array may have the first pattern. Each of the first main memory cell array and the second main memory cell array may include odd-numbered bit lines having the first pattern and even-numbered bit lines having the second pattern. The first pattern may have a first CD distribution, and the second pattern may have a second CD distribution, the first and second CD distributions having different peak values.

The dummy array may include an odd number of dummy bit lines, and the memory cell array may further include a bit line selecting signal, the bit line selecting signal being configured to be applied to bit lines in the first main memory cell array and to bit lines in the second main memory cell array after performing swizzling on each of the bit lines in the second main memory cell array with an adjacent bit line when selecting memory cells in the memory cell array. A first bit line in the first main memory cell array and a first bit line in the second main memory cell array may have different patterns. Odd-numbered bit lines of the first main memory cell array and even-numbered bit lines of the second main memory cell array may have the first pattern, and even-numbered bit lines of the first main memory cell array and odd-numbered bit lines of the second main memory cell array have the second pattern. The first pattern may have a first CD distribution, and the second pattern may have a second CD distribution, the first and second CD distributions having different peak values.

At least one of the above and other features and advantages of the present invention may be realized by providing a memory core, including a memory cell array having a double-patterned layout, the memory cell array having a plurality of first bit lines spaced apart from each other and having a first pattern, a plurality of second bit lines spaced apart from each other and having a second pattern, the second bit lines being between the first bit lines to define an alternating array of first and second bit lines, the first and second patterns being different from each other, a first main memory cell array defined by a first portion of the alternating array, a second main memory cell array defined by a second portion of the alternating array, bit lines in the first main memory cell array having a substantially same regularity as bit lines in the second main memory cell array, and a dummy array between the first main memory cell array and the second main memory cell array.

The dummy array may include an even number of dummy bit lines. A first bit line in the first main memory cell array and a first bit line in the second main memory cell array may have a substantially same pattern. Each of the first main memory cell array and the second main memory cell array may include odd-numbered bit lines having the first pattern and even-numbered bit lines having the second pattern. The first pattern may have a first CD distribution, and the second pattern may have a second CD distribution, the first and second CD distributions having different peak values.

At least one of the above and other features and advantages of the present invention may be realized by providing a method of forming a layout of a semiconductor device, including forming a plurality of first and second bit lines spaced apart from each other via double patterning to define an alternating array of first and second bit lines of a memory cell array, such that first and second main memory cell arrays are formed in the memory cell array, bit lines in the first main memory cell array having a substantially same regularity as bit lines in the second main memory cell array, and forming a dummy array between the first main memory cell array and the second main memory cell array.

The dummy array may be formed to include an even number of dummy bit lines. A first bit line in the first main memory cell array and a first bit line in the second main memory cell array may be formed using a same exposure process. Each of the first main memory cell array and the second main memory cell array may include an odd-numbered bit line formed using a first exposure process and an even-numbered bit line formed using a second exposure process. A CD distribution of the first exposure process and a CD distribution of the second exposure process may have different peak values. The dummy array may be formed to include an odd number of bit lines, and a bit-line selecting signal may be directly applied to bit lines in the first main memory cell array, and the bit-line selecting signal may be applied to bit lines in the second main memory cell array after performing swizzling on each of the bit lines in the second main memory cell array with a neighboring bit line when selecting memory cells in the memory cell array.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
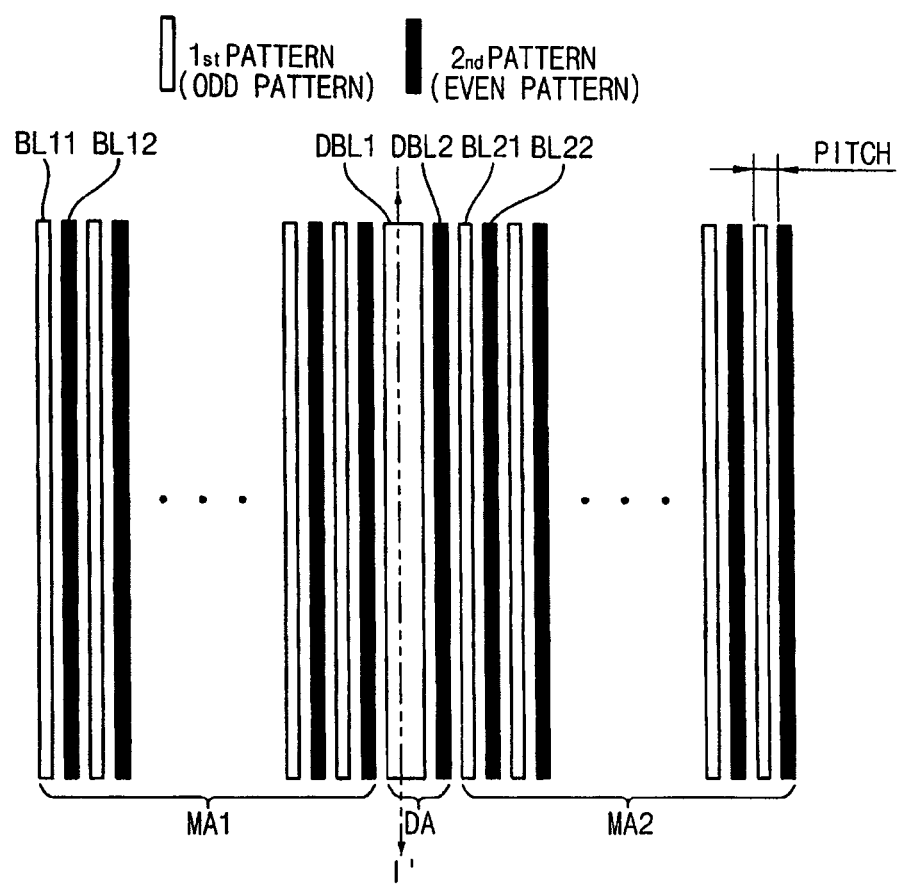
FIG. 1 illustrates a diagram of a layout of bit lines in a memory cell array according to an embodiment of the present invention.

Korean Patent Application No. 10-2007-0032469, filed on Apr. 2, 2007, in the Korean Intellectual Property Office, and entitled: "Semiconductor Memory Device and Method of Forming a Layout of the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will also be understood that when a layer or element is referred to as being "between" two layers or elements, it can be the only layer or element between the two layers or elements, or one or more intervening layers and/or elements may also be present. In addition, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

As used herein, the expressions "first," "second," etc. are used solely to distinguish one element from another and, therefore, do not limit the elements in any way. For example, a first element could be termed a second element and, similarly, a second element could be termed a first element, without departing from the scope of the present invention.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Unless otherwise defined, all terms used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a schematic diagram of a layout of bit lines of a memory cell array 100 of a semiconductor device, e.g., a flash memory device, formed using a double patterning technology according to an example embodiment of the present invention. It is noted that FIG. 1 illustrates only a layout of the bit lines of the memory cell array 100 for convenience, and that the memory cell array 100 may also include, e.g., active areas, word lines, and selection lines. The memory cell array 100 may be included in a memory core of any suitable semiconductor memory device. The memory cell array 100 may have a vertical structure, but other memory cell array structures are within the scope of the present invention.

Referring to FIG. 1, the memory cell array 100 may include a first main memory cell array MA1, a second main memory cell array MA2, and a dummy array DA. Each of the first main memory cell array MA1 and second main memory cell array MA2 may include a plurality of bit lines, and the dummy array DA may include a plurality of dummy bit lines. A layout of the bit lines and of the dummy bit lines may be configured to have a fine pattern, e.g., a pitch value below about 50 nm, formed by a double patterning technology (DPT).

Figure 2:
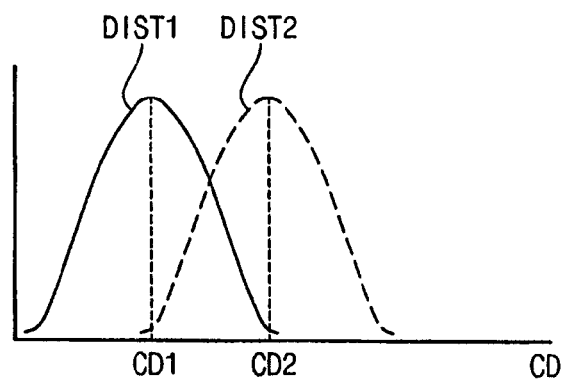
FIG. 2 illustrates a diagram of CD distributions of bit lines in the layout of the memory cell array of FIG. 1.

The DPT may refer to a technology of forming patterns of a semiconductor integrated circuit using a double exposure technology. More specifically, as illustrated in FIG. 2, the bit lines of the memory cell array 100 may be formed by employing a first pattern, i.e., a pattern having a first CD distribution DIST1 having a peak value at CD1, followed by employing a second pattern, i.e., a pattern having a second CD distribution DIST2 value having a peak value at CD2. As further illustrated in FIG. 2, the first and second CD distributions DIST1 and DIST2 of the first and second patterns, respectively, may be offset with respect to each other, so the peak value CD 1 of the first pattern may be different than the peak value CD2 of the second pattern. As such, the first and second patterns may be different from each other with respect to CD distribution and peak value.

Formation of the bit lines of the first main memory cell array MA1 and second main memory cell array MA2 via DPT may provide at least one alternating array of first and second patterns, e.g., one line of a second pattern between two lines of the first pattern. For example, as illustrated in FIG. 1, white lines may denote bit lines formed by the first pattern, and may alternate with black lines denoting bit lines formed by the second pattern. As such, the alternating array may be divided into a first portion to define the first main memory cell array MA1 and a second portion to define the second main memory cell array MA2. The first and second portions may be spaced apart, and the dummy array DA may be positioned therebetween. Accordingly, each of the first main memory cell array MA1 and second main memory cell array MA2 may include a plurality of bit lines formed by both the first and second patterns.

As further illustrated in FIG. 1, the layout and regularity of the bit lines may be configured by adjusting a structure of the dummy array DA of the memory cell array 100. More specifically, the dummy array DA may be between the first and second main memory cell arrays MA1 and MA2, and may be a partial array of the memory cell array 100 including inoperative transistors in a semiconductor integrated circuit. As illustrated in FIG. 1, the dummy array DA may be configured to have an even number of dummy bit lines. For example, as further illustrated in FIG. 1, the dummy array DA may include an odd-numbered bit line DBL1 and an even-numbered bit line DBL2. The dummy array DA may further include a common source line contact (CSL CNT) (not shown).

Configuration of the dummy array DA to include an even number of dummy bit lines may facilitate forming the first and second main memory cell arrays MA1 and MA2 to have bit lines with a substantially uniform regularity. In this respect it is noted that a "substantially uniform regularity" refers to a substantially symmetrical structure along vertical and horizontal directions, so that pitch and electrical properties, e.g., capacitance, resistance, and so forth, of all the bit lines may be substantially uniform through the memory cell array 100. For example, all odd-numbered bit lines in the first main memory cell array MA1 and all odd-numbered bit lines in the second main memory cell array MA2 may be formed by an odd-numbered pattern, i.e., the first pattern, to maintain symmetry. Similarly, all even-numbered bit lines in the first main memory cell array MA1 and all even-numbered bit lines in the second main memory cell array MA2 may be formed by an even-numbered pattern, i.e., the second pattern. Accordingly, as illustrated in FIG. 1, both a first bit line BL11 in the first main memory cell array MA1 and a first bit line BL21 in the second main memory cell array MA2 may be formed by the odd-numbered pattern. Similarly, both a second bit line BL12 in the first main memory cell array MA1 and a second bit line BL22 in the second main memory cell array MA2 may be formed by the even-numbered pattern.

Accordingly, the bit lines of the memory cell array 100 may include odd-numbered bit lines and even-numbered bit lines formed by the DPT and arranged alternately. A pair of adjacent bit lines may be connected to a unit page buffer (not shown), and may include one odd-numbered bit line and one even-numbered bit line. Accordingly, when data is read from the memory cell array 100, an odd-numbered bit line or an even-numbered bit line may be alternatively selected.

Odd-numbered bit lines of the first main memory cell array MA1 and the second main memory cell array MA2 may be formed using a same exposure process. For example, the first bit line BL11 in the first main memory cell array MA1 and the first bit line BL21 in the second main memory cell array MA2 may be formed using the odd-numbered pattern in an odd-numbered exposure process. Similarly, even-numbered bit lines of the first main memory cell array MA1 and the second main memory cell array MA2 may be formed using a same exposure process. For example, the second bit line BL12 in the first main memory cell array MA1 and the second bit line BL21 in the second main memory cell array MA2 may be formed using the even-numbered pattern in an even-numbered exposure process. The CD distribution used in the odd-numbered exposure process may have a different peak value than the CD distribution used in the even-numbered exposure process.

Figure 3:
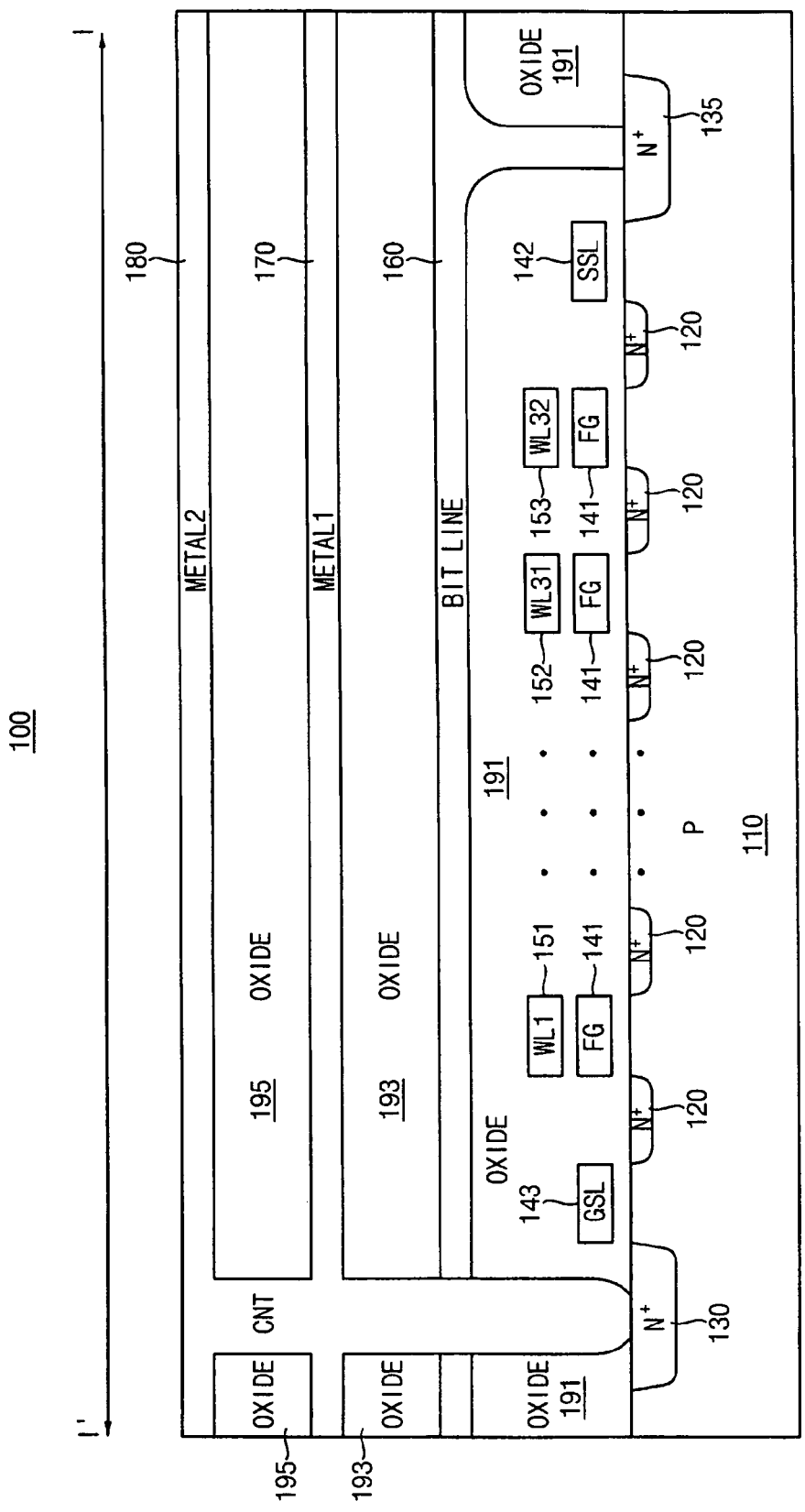
FIG. 3 illustrates a cross-sectional diagram of a memory cell array along line I-I' of FIG. 1.

FIG. 3 illustrates a schematic cross-sectional diagram of a vertical structure of the memory cell array 100 of FIG. 1 along line I-I'. Referring to FIG. 3, the memory cell array 100, e.g., a flash memory device, may include a P-well 110, N+ diffusion areas 120 in the P-well 110, a bit-line layer 160 on the P-well 110, first, second, and third oxide layers 191, 193, and 195 on the P-well 110, and first and second metal layers 170 and 180. The P-well 110 may also include a N+ diffusion area 135 corresponding to a drain region of a first selection transistor and a N+ diffusion area 130 corresponding to a source region of a second selection transistor.

A plurality of active devices may be formed in the first oxide layer 191, i.e., between the bit line layer 160 and the P-well 110. More specifically, a plurality of floating gates FG may be formed in the first oxide layer 191 between adjacent N+ diffusion areas 120. A plurality of control gates, e.g., first, second, and third control gates 151, 152, and 153, may be formed above respective floating gates FG in the first oxide layer 191 for memory transistors. A gate 142 of the first selection transistor may be formed in the first oxide layer 191 between the N+ diffusion area 135 and an adjacent N+ diffusion area 120. A gate 143 of the second selection transistor may be formed in the first oxide layer 191 between the N+ diffusion area 130 and an adjacent N+ diffusion area 120. A first selection line SSL may be connected to the gate 142 of the first selection transistor, and a second selection line GSL may be connected to the gate 143 of the second selection transistor. Further, word-line driving signals WL1 to WL32 may be applied to the control gates 151, 152, and 153 of the memory transistors, respectively.

The second oxide layer 193 may be between the bit line layer 160 and the first metal layer (METAL1) 170. The third oxide layer 195 may be between the first metal layer 170 and the second metal layer (METAL2) 180. The second metal layer 180 may correspond to a common source line CSL, and may be electrically coupled to the N+ diffusion area 130 via a contact CNT. As illustrated in FIG. 3, the bit line layer 160 in the dummy array DA of the memory cell array 100 may be cut by the contact CNT, so the dummy array DA of the memory cell array may be floated, and corresponding active devices under the bit line layer 160 may not operate.

Formation of a semiconductor device, e.g., a flash memory device, by a DPT according to embodiments of the present invention may be advantageous in providing a layout of bit lines having both a reduced pitch and an improved regularity, so the bit lines may have substantially uniform electrical properties, e.g., uniform unit resistance and uniform unit capacitance. As such, the active devices below the bit lines may exhibit uniform electrical properties as well. Further, patterning via the DPT may substantially decrease a pitch of the bit lines. For example, a pitch of the bit lines formed according to an embodiment of the present invention, may equal about half a pitch of the conventional bit lines, i.e., bit lines formed via a single exposure technology.

Figure 4:
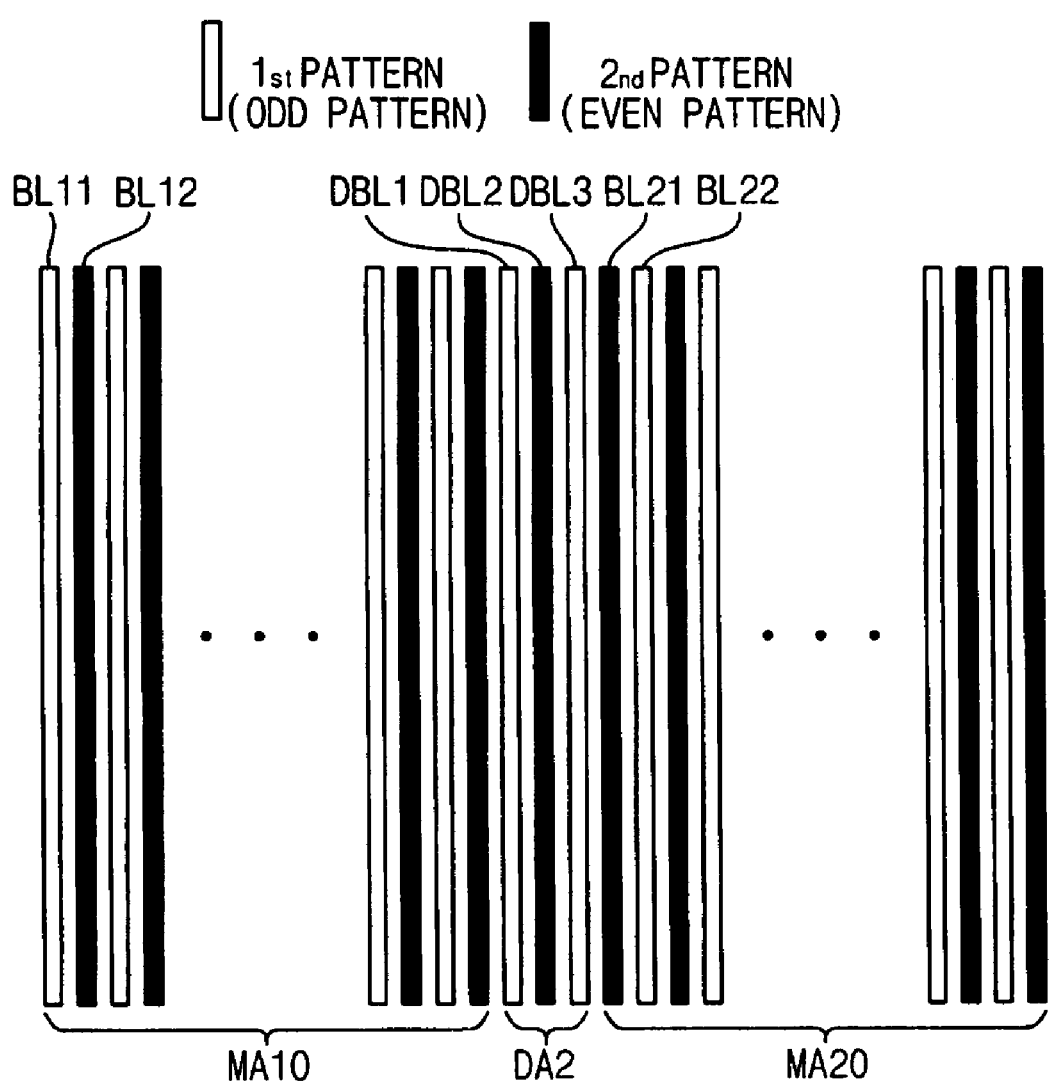
FIG. 4 illustrates a diagram of a layout of bit lines in a memory cell array according to another embodiment of the present invention.

According to another embodiment illustrated in FIG. 4, a memory cell array may include a first main memory cell array MA10, a second main memory cell array MA20, and a dummy array DA2. The memory cell array in FIG. 4 may include a plurality of bit lines configured in a layout formed using the DPT. In FIG. 4, white lines may denote bit lines formed using the first pattern, i.e., the odd-numbered pattern, and the black lines may denote bit lines formed using the second pattern, i.e., the even-numbered pattern. The dummy array DA2 may be a partial array of the memory cell array including inoperative transistors in a semiconductor integrated circuit. For example, the dummy array DA2 may include a common source line contact (not shown).

In FIG. 4, the dummy array DA2 may be located between the first main memory cell array MA10 and the second main memory cell array MA20. The dummy array DA2 may have an odd number of dummy bit lines. For example, as illustrated in FIG. 4, the dummy array DA2 may include three dummy bit lines, i.e., DBL1, DBL2, and DBL3. Accordingly, bit lines configured at equivalent positions within the first and second main memory cell arrays MA10 and MA20 may be formed by different patterns. For example, a first bit line BL11 in the first main memory cell array MA10 may be formed using the odd-numbered pattern and the first bit line BL21 in the second main memory cell array MA20 may be formed using the even-numbered pattern. Regularity of the bit lines in the first and second main memory cell arrays MA10 and MA20 may be maintained, however, via swizzling of the bit lines.

More specifically, in the semiconductor memory device having the layout structure illustrated in FIG. 4, a bit line selecting signal may be directly applied to bit lines in the first main memory cell array MA10, and the bit-line selecting signal may be applied to bit lines in the second main memory cell array MA20 after performing swizzling on each of the bit lines in the second main memory cell array MA2 with an adjacent neighboring bit line when selecting memory cells in the memory cell array. In other words, bit lines in the first main memory cell array M10 may be programmed or be physical connected to bit lines adjacent to corresponding bit lines, i.e., bit lines having a substantially same pattern, in order to provide regularity. For example, the first bit line BL11 in the first main memory cell array MA10 may be associated with the second bit line BL22 of the second main memory cell array MA20, such that bit line selecting transistors (not shown) for the bit lines BL11 and BL22 may be simultaneously turned on based on a bit line selecting signal. Accordingly, bit lines may be simultaneously selected by swizzling in order to maintain regularity of the main memory cells of the first and second main memory cell arrays MA10 and M20. As such, a symmetrical structure formed by two different patterns may be maintained, e.g., at the word level.

In the memory cell array of the semiconductor device of FIG. 4, e.g., flash memory device, the first bit line BL11 in the first main memory cell array MA10 and the first bit line BL21 in the second main memory cell array MA20 may be formed using different exposure processes. For example, odd-numbered bit lines of the first main memory cell array MA10 and even-numbered bit lines of the second main memory cell array MA20 may be formed using the first exposure process. In the same way, even-numbered bit lines of the first main memory cell array MA10 and odd-numbered bit lines of the second main memory cell array MA20 may be formed using the second exposure process. A CD distribution used in the first exposure process may have a different peak value as compared to a CD distribution used in the second exposure process.

A layout of bit lines in a semiconductor memory device and method of manufacturing the same according to embodiments of the present invention may be advantageous in maintaining regularity among main memory cells during DPT. Therefore, the semiconductor memory device may decrease the minimum pitch, i.e., a space between bit lines in the memory cell array, in a DPT, so the semiconductor memory device may have an overall reduced size in the semiconductor integrated circuit. The layout of bit lines in the semiconductor memory device and method of manufacturing the same may be applied to any semiconductor memory devices, e.g., a flash memory device, a dynamic random access memory (DRAM) device, and so forth.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device having a double-patterned memory cell array, the memory cell array comprising:
a plurality of first bit lines spaced apart from each other and having a first pattern;
a plurality of second bit lines spaced apart from each other and having a second pattern, the second bit lines being between the first bit lines to define an alternating array of first and second bit lines, the first and second patterns being different from each other;
a first main memory cell array defined by a first portion of the alternating array;
a second main memory cell array defined by a second portion of the alternating array, bit lines in the first main memory cell array having a substantially same regularity as bit lines in the second main memory cell array; and
a dummy array between the first main memory cell array and the second main memory cell array, the dummy array including a plurality of dummy bit lines,
wherein the first pattern has a first critical dimension distribution and the second pattern has a second critical dimension distribution, the first and second critical dimension distributions having different peak values.

2. The semiconductor memory device as claimed in claim 1, wherein the dummy array includes an even number of dummy bit lines.

3. The semiconductor memory device as claimed in claim 2, wherein a first bit line in the first main memory cell array and a first bit line in the second main memory cell array have the first pattern.

4. The semiconductor memory device as claimed in claim 2, wherein each of the first main memory cell array and the second main memory cell array includes odd-numbered bit lines having the first pattern and even-numbered bit lines having the second pattern.

5. The semiconductor memory device as claimed in claim 1, wherein the dummy array includes an odd number of dummy bit lines, and bit lines in the first main memory cell array are configured to be programmed or be physically connected to bit lines adjacent to corresponding bit lines.

6. The semiconductor memory device as claimed in claim 5, wherein a first bit line in the first main memory cell array and a first bit line in the second main memory cell array have different patterns.

7. The semiconductor memory device as claimed in claim 5, wherein odd-numbered bit lines of the first main memory cell array and even-numbered bit lines of the second main memory cell array have the first pattern, and even-numbered bit lines of the first main memory cell array and odd-numbered bit lines of the second main memory cell array have the second pattern.

8. A memory core, comprising:
a memory cell array having a double-patterned layout, the memory cell array including,
a plurality of first bit lines spaced apart from each other and having a first pattern;
a plurality of second bit lines spaced apart from each other and having a second pattern, the second bit lines being between the first bit lines to define an alternating array of first and second bit lines, the first and second patterns being different from each other;
a first main memory cell array defined by a first portion of the alternating array;
a second main memory cell array defined by a second portion of the alternating array, bit lines in the first main memory cell array having a substantially same regularity as bit lines in the second main memory cell array; and
a dummy array between the first main memory cell array and the second main memory cell array, the dummy array including a plurality of dummy bit lines,
wherein the first pattern has a first critical dimension distribution and the second pattern has a second critical dimension distribution, the first and second critical dimensions distributions having different peak values.

9. The memory core as claimed in claim 8, wherein the dummy array includes an even number of dummy bit lines.

10. The memory core as claimed in claim 8, wherein a first bit line in the first main memory cell array and a first bit line in the second main memory cell array have a substantially same pattern.

11. The memory core as claimed in claim 8, wherein each of the first main memory cell array and the second main memory cell array includes an odd-numbered bit lines having the first pattern and even-numbered bit lines having the second pattern.

12. A method of forming a layout of a semiconductor device, comprising:
forming a plurality of first and second bit lines spaced apart from each other via double patterning to define an alternating array of first and second bit lines of a memory cell array, such that first and second main memory cell arrays are formed in the memory cell array, bit lines in the first main memory cell array having a substantially same regularity as bit lines in the second main memory cell array; and
forming a dummy array between the first main memory cell array and the second main memory cell array, the dummy array including a plurality of dummy bit lines, wherein:
the first bit lines have a first pattern and the second bit lines have a second pattern that is different from the first pattern, and the second bit lines are between the first bit lines, and
the first pattern has a first critical dimension distribution and the second pattern has a second critical dimension distribution, the first and second critical dimension distributions having different peak values.

13. The method as claimed in claim 12, wherein the dummy array is formed to include an even number of dummy bit lines.

14. The method as claimed in claim 13, wherein a first bit line in the first main memory cell array and a first bit line in the second main memory cell array are formed using a same exposure process.

15. The method as claimed in claim 13, wherein each of the first main memory cell array and the second main memory cell array includes an odd-numbered bit line that is formed using a first exposure process and an even-numbered bit line that is formed using a second exposure process.

16. The method as claimed in claim 12, wherein the dummy array is formed to include an odd number of bit lines, and bit lines in the first main memory cell array are configured to be programmed or be physically connected to bit lines adjacent to corresponding bit lines.

* * * * *